(12) United States Patent
Sato et al.

(10) Patent No.: US 9,413,355 B2
(45) Date of Patent: Aug. 9, 2016

(54) INFORMATION PROCESSING APPARATUS AND CONTROL METHOD THEREFOR

(71) Applicant: CANON KABUSHIKI KAISHA, Tokyo (JP)

(72) Inventors: Yoshikazu Sato, Nagareyama (JP); Daisuke Matsunaga, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/855,925

(22) Filed: Sep. 16, 2015

(65) Prior Publication Data

US 2016/0094228 A1 Mar. 31, 2016

(30) Foreign Application Priority Data

Sep. 26, 2014 (JP) ................................. 2014-197510

(51) Int. Cl.
| | |
|---|---|
| G06F 7/38 | (2006.01) |
| H03K 19/173 | (2006.01) |
| H03K 19/177 | (2006.01) |
| G06F 3/12 | (2006.01) |
| G06K 9/00 | (2006.01) |
| G06K 9/20 | (2006.01) |

(Continued)

(52) U.S. Cl.
CPC ............ *H03K 19/1733* (2013.01); *G06F 3/126* (2013.01); *G06F 3/1208* (2013.01); *G06K 9/00261* (2013.01); *G06K 9/209* (2013.01); *H03K 19/1776* (2013.01); *H03K 19/17724* (2013.01); *H03K 19/17756* (2013.01); *H04N 5/23219* (2013.01); *H04N 21/23418* (2013.01)

(58) Field of Classification Search
CPC ...... G06F 3/126; G06F 3/1205; G06F 3/1207; G06F 3/1259; G06T 1/00; H04N 1/00005; H04N 1/32587; H04L 67/34; Y02B 60/1271; H03K 19/1733; H03K 19/17756; H03K 19/1776
See application file for complete search history.

(56) References Cited

U.S. PATENT DOCUMENTS 8,345,125 B2 * 1/2013 Kirsch ............... G06K 9/00261
348/218.1
8,417,932 B2 * 4/2013 Musha ................. G06F 9/4401
709/220

(Continued)

FOREIGN PATENT DOCUMENTS

| JP | 2010-049510 A | 3/2010 |
|---|---|---|
| JP | 2013-098823 A | 5/2013 |

*Primary Examiner* — Vibol Tan
(74) *Attorney, Agent, or Firm* — Carter, DeLuca, Farrell & Schmidt, LLP

(57) ABSTRACT

An information processing apparatus comprises: a programmable processing unit capable of changing a circuit configuration by a configuration; a first control unit connected to the programmable processing unit, that instructs the programmable processing unit to perform a first configuration for a first job to be processed by the first control unit, and processes the first job by means of the programmable processing unit which has changed the circuit configuration according to the instruction; and a second control unit connected to the programmable processing unit, wherein the first control unit further instructs the programmable processing unit to perform a second configuration for a second job to be processed by the second control unit, and wherein the second control unit processes the second job by means of the programmable processing unit which has changed the circuit configuration according to the instruction.

14 Claims, 11 Drawing Sheets

(51) Int. Cl.
  *H04N 5/232* (2006.01)
  *H04N 21/234* (2011.01)

(56) References Cited

U.S. PATENT DOCUMENTS

| | | | |
|---|---|---|---|
| 8,587,835 B2 * | 11/2013 | Sato | H04N 1/00803 358/1.18 |
| 8,675,099 B2 * | 3/2014 | Pope | G06K 9/00261 348/222.1 |
| 8,801,307 B2 * | 8/2014 | Kiuchi | H01L 21/67132 400/613 |
| 9,037,807 B2 * | 5/2015 | Vorbach | G06F 12/00 711/147 |
| 9,072,210 B2 * | 6/2015 | Kiuchi | H01L 21/67132 |
| 9,122,482 B2 * | 9/2015 | Inoue | H04N 1/00896 |
| 9,261,845 B2 * | 2/2016 | Ichihashi | G03G 15/6582 |
| 9,268,515 B2 * | 2/2016 | Kayama | G06F 3/126 |

* cited by examiner

201

| JOB REQUEST FUNCTION | SUPPORT DEVICE | FPGA USAGE | CONFIGURATION DATA |
|---|---|---|---|
| EXTENSION OCR FUNCTION | EXTENSION PROCESSING UNIT | YES | ADV_OCR.config |
| OBJECT RECOGNITION FUNCTION | EXTENSION PROCESSING UNIT | YES | OBJ_ASYS.config |
| PHOTO IMAGE PROCESSING FUNCTION | STANDARD PROCESSING UNIT | YES | PHOTO.config |
| DATA TRANSMISSION FUNCTION | STANDARD PROCESSING UNIT | NO | - |

F I G. 5
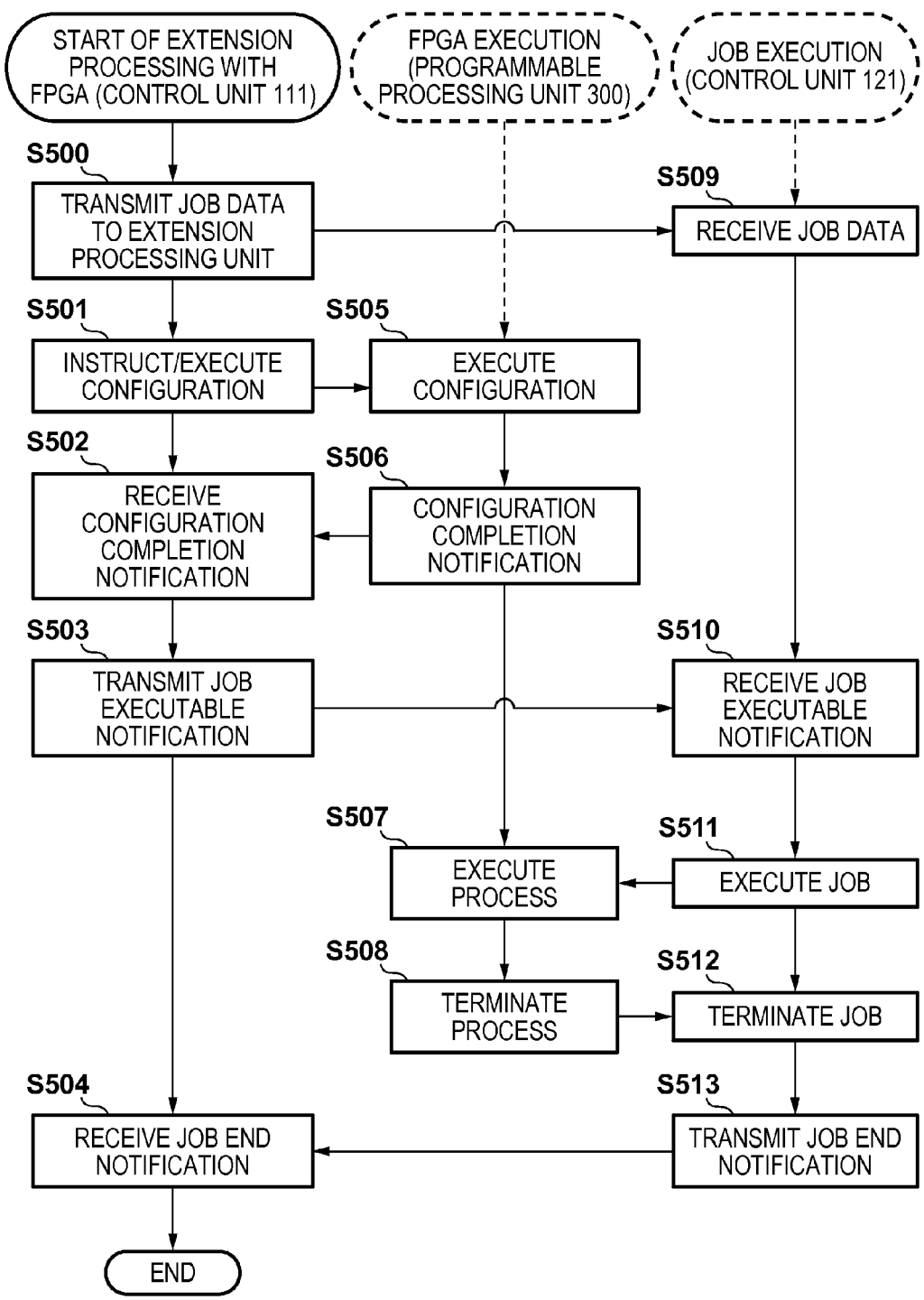

INFORMATION PROCESSING APPARATUS AND CONTROL METHOD THEREFOR

BACKGROUND OF THE INVENTION

1. Field of the Invention

The present invention relates to an information processing apparatus, and a control method therefor, in particular, to a system including a programmable logic device.

2. Description of the Related Art

Various systems in each of which an FPGA (Field Programmable Gate Array) is mounted are proposed. For example, Japanese Patent Laid-Open No. 2010-049510 proposes a system configuration where one FPGA is mounted for each of a plurality of CPU modules existing in the system. If a high-performance FPGA is applied to the system configuration proposed in Japanese Patent Laid-Open No. 2010-049510, the cost becomes extremely high. To cope with this, a system configuration is considered where two or more CPUs share one FPGA by using the FPGA that has a plurality of high-speed ports (for example, PCI Express) to which the CPUs are connectable (to be referred to as an "FPGA sharing configuration" hereinafter).

On the other hand, Japanese Patent Laid-Open No. 2013-098823 discloses, as an FPGA configuration method, a new method different from a conventional method of loading configuration data from a ROM. The disclosed method is a method of loading the configuration data from an HDD to an FPGA by using a CPU as a master device (to be referred to as a "CPU master configuration" hereinafter). With the CPU master configuration, the processing contents of the FPGA can be updated only by replacing and loading a file in the HDD without rewriting the ROM.

In the case of a general FPGA device, there is only one high-speed port corresponding to the CPU master configuration. That is, even if two or more CPUs are connected to the FPGA as in the FPGA sharing configuration, there is only one CPU which becomes a master device for a configuration. In this case, the CPU other than the master device cannot execute the configuration, resulting in the need to request the configuration for a master device CPU. However, if such a configuration request process is incorporated in software, a software configuration becomes complicated for the reason of occurrence of inter-CPU communication or the like, and it will take time before a request source CPU starts using the FPGA.

SUMMARY OF THE INVENTION

The present invention has been made in consideration of the above-described problems, and proposes a method of, in an FPGA sharing configuration, executing a CPU master configuration with a brief software configuration and allowing a CPU to start a process using an FPGA at an appropriate timing.

According to one aspect of the present invention, there is provided an information processing apparatus comprising: a programmable processing unit capable of changing a circuit configuration by a configuration; a first control unit connected to the programmable processing unit, configured to instruct the programmable processing unit to perform a first configuration for a first job to be processed by the first control unit, and to process the first job by means of the programmable processing unit which has changed the circuit configuration according to the instruction; and a second control unit connected to the programmable processing unit, wherein the first control unit is further configured to instruct the programmable processing unit to perform a second configuration for a second job to be processed by the second control unit, and wherein the second control unit is configured to process the second job by means of the programmable processing unit which has changed the circuit configuration according to the instruction.

According to another aspect of the present invention, there is provided an information processing apparatus comprising: a programmable processing unit capable of rewriting processing contents by a configuration; and at least two control units which are connected to the programmable processing unit and configured to share the programmable processing unit, wherein one control unit out of the at least two control units includes a configuration control unit configured to control a configuration of the programmable processing unit in accordance with an accepted job, each of the at least two control units includes a setting unit configured to set, for the programmable processing unit, a control unit configured to process the job by using the programmable processing unit, and the programmable processing unit includes a notification unit configured to notify, after the configuration, each control unit set by the setting unit of information indicating that the configuration has ended.

According to another aspect of the present invention, there is provided a control method of an information processing apparatus including a programmable processing unit capable of changing a circuit configuration by a configuration, a first control unit connected to the programmable processing unit and a second control unit connected to the programmable processing unit, the method comprising: instructing, by the first control unit, the programmable processing unit to perform a first configuration for a first job to be processed by the first control unit; and processing, by the first control unit, the first job by means of the programmable processing unit which has changed the circuit configuration according to the instruction, wherein the method is further comprises: instructing, by the first control unit, the programmable processing unit to perform a second configuration for a second job to be processed by the second control unit; and processing, by the second control unit, the second job by means of the programmable processing unit which has changed the circuit configuration according to the instruction.

The present invention obviates the need of a configuration request process among CPUs. This makes it possible to implement a configuration with the brief software configuration and allows each CPU to start the process using the FPGA at the appropriate timing.

Further features of the present invention will become apparent from the following description of exemplary embodiments (with reference to the attached drawings).

BRIEF DESCRIPTION OF THE DRAWINGS

FIG. 5 is a flowchart showing extension processing with an FPGA according to the first embodiment;

DESCRIPTION OF THE EMBODIMENTS

In embodiments below, a "CPU master configuration" described in the background of the invention will simply be referred to as a "configuration".

<First Embodiments>

[Overall Arrangement of System]

Figure 1:
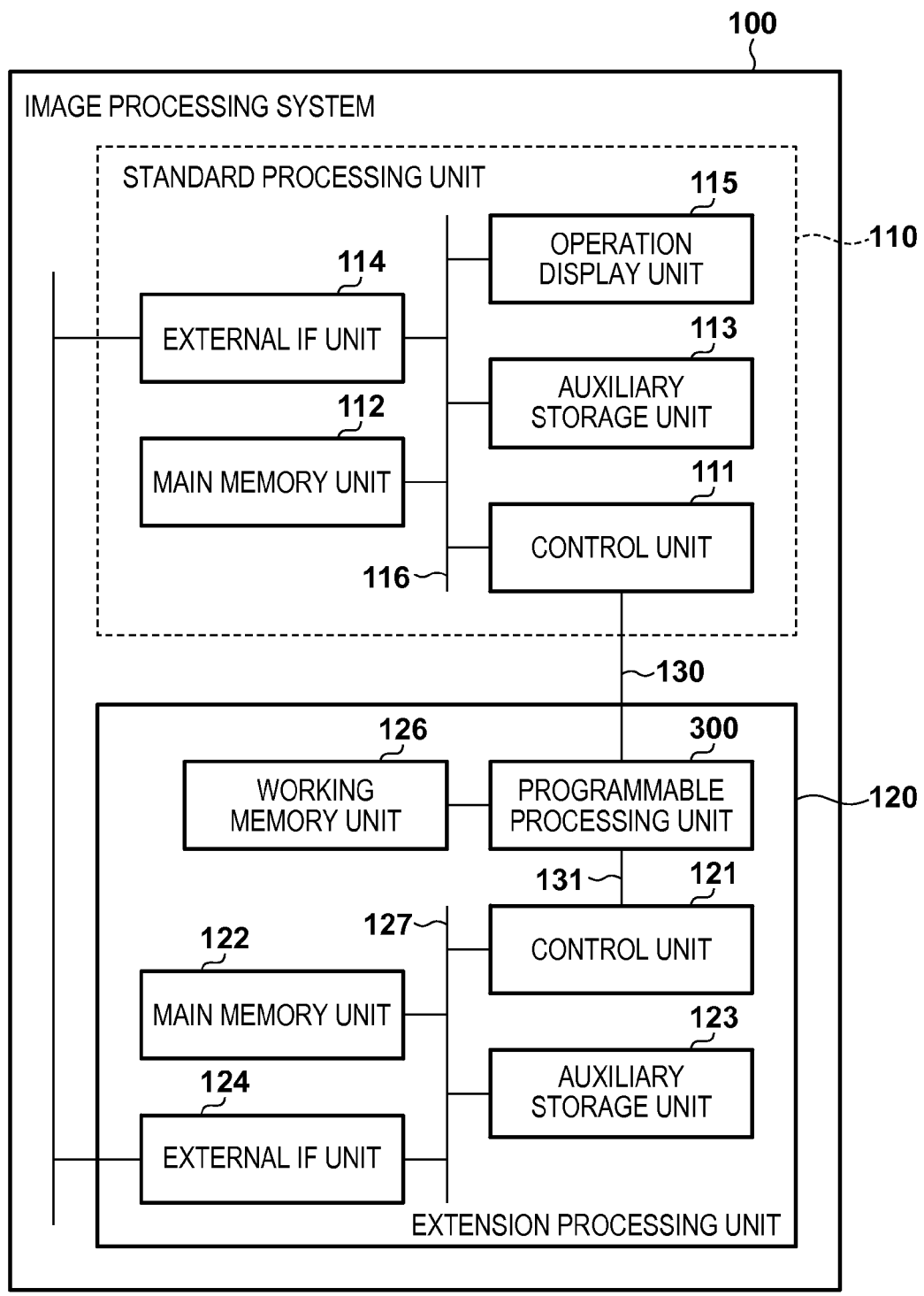
FIG. 1 is a block diagram showing an overall arrangement example of an image processing system of the present invention.

FIG. 1 is a block diagram showing an overall arrangement example of an image processing system 100 according to this embodiment. The image processing system will be exemplified in this embodiment. However, another information processing apparatus may be exemplified. A standard processing unit 110 executes operation control of the image processing system 100 and basic image processing such as color space conversion, halftoning, and the like. The standard processing unit 110 is generally referred to as a main controller, a motherboard, or the like. The internal block of the standard processing unit 110 will be described below.

A control unit 111 is a central processing unit (CPU) configured to control the standard processing unit 110. In this embodiment, the control unit 111 incorporates at least one PCI Express port. A main memory unit 112 is a storage device which is made of an SDRAM (Synchronous Dynamic Random Access Memory) or the like and allows high-speed access. Image data and print data processed by the control unit 111 are rasterized in the main memory unit 112. In addition, software executed by the control unit 111 is loaded in the main memory unit 112. An auxiliary storage unit 113 is a non-volatile storage device such as a hard device or a flash memory, and stores the image data, the print date, software, and the like.

An external IF unit 114 is an interface compatible with Ethernet® or a USB (Universal Serial Bus) and includes a MAC, a PHY, and a connector. In FIG. 1, the standard processing unit 110 is connected to only an extension processing unit 120 via the external IF unit 114. However, the standard processing unit 110 may be connected to an external information terminal such as a network server or a client PC. An operation display unit 115 is a device such as a touch panel having both a display function and an operation function, and functions as the user interface unit of the standard processing unit 110. Note that the operation display unit 115 may be constituted by combining a liquid crystal display (not shown) and hard keys (not shown). The above-described configuration is arranged on a system bus 116.

The extension processing unit 120 is configured to be able to execute a process of a type different from a process of the standard processing unit 110 or is configured to be able to execute even a process of the same type faster. The extension processing unit 120 is generally referred to as ad-on hardware, an accelerator, or the like. The internal block of the extension processing unit 120 will be described below.

A control unit 121 is a central processing unit (CPU) configured to control the extension processing unit 120. In this embodiment, the control unit 121 incorporates at least one PCI Express port. A main memory unit 122 is a storage device which is made of an SDRAM or the like and allows high-speed access. Data processed by the control unit 121 are rasterized in the main memory unit 122. In addition, software executed by the control unit 121 is loaded in the main memory unit 122. An auxiliary storage unit 123 is a non-volatile storage device such as a flash memory, and stores image data, software, and the like.

An external IF unit 124 is an interface compatible with Ethernet® or a USB and includes a MAC, a PHY, and a connector. In FIG. 1, the extension processing unit 120 is connected to only the standard processing unit 110 via the external IF unit 124. However, the extension processing unit 120 may be connected to the external information terminal such as the network server or the client PC. The above-described configuration is arranged on a system bus 127.

A programmable processing unit 300 is a device connected to the control unit 111 and the control unit 121 via interfaces 130 and 131 constituted by a PCI Express signal and an FPGA control signal. The programmable processing unit 300 is not particularly limited as long as it is a programmable device. This embodiment will be described, however, assuming that the programmable processing unit 300 is an FPGA (Field Programmable Gate Array). The programmable processing unit 300 according to this embodiment incorporates at least two PCI Express ports. An FPGA control signal includes an InitDone signal serving as a signal indicating the completion of an FPGA configuration and a ProcDonoe_0/1 signal serving as a signal indicating the execution end status of configured logic. Details of each signal will be described later with reference to FIG. 3.

A working memory unit 126 is a storage device which is made of an SDRAM or the like and allows high-speed access. The working memory unit 126 is connected to the programmable processing unit 300 and functions as a work memory device. The overall arrangement example of the image processing system 100 according to this embodiment has been described above.

[Job Data Structure]

Figures 2A, 2B:
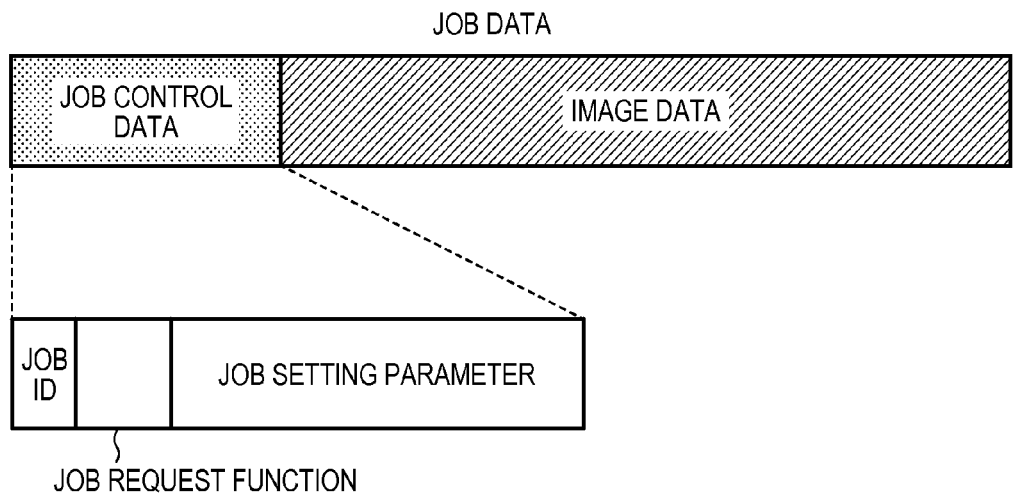
FIGS. 2A and 2B are views showing the arrangement example of data of the present invention.

FIG. 2A exemplifies the data structure of job data according to this embodiment. A description will be made on only the data structure of the job data here. The processing sequence of the job data will be described in detail later.

The job data includes job control data and image data. The image data is to be processed by jobs. The image data may be either RAW data or JPEG, JBIG, TIFF, or the like as long as it has a general image data format.

The job control data includes information such as a job ID, job request functions, and a job setting parameter. The job ID is information unique to each job. The job data can be specified uniquely by referring to the job ID. The job request functions are information indicating functions required to execute the jobs. Details of the job request functions will be described later with reference to FIG. 2B. The job setting parameter is the value of an adjustment parameter selected or arbitrary input by a user when generating the job data in the operation display unit 115 or the external information terminal. Information included in the job setting parameter includes, for example, a density value and selection information of monochrome/full color.

FIG. 2B shows an example of a job request function correspondence table 201 in which the job request functions are associated with information related to those functions. The column of the job request functions shows functions that can be processed in the image processing system 100. The column of support devices shows the devices capable of executing the corresponding job request functions. The column of FPGA usage shows whether the FPGA (programmable processing unit 300) needs to be used when executing the corresponding job request functions. The column of configuration data shows information capable of uniquely specifying FPGA configuration data needed when executing the corresponding job request functions. The standard processing unit 110 stores, in the main memory unit 112 or the auxiliary storage unit 113, the job request function correspondence table 201 as shown in FIG. 2B. The control unit 111 can determine, based on information on the job request functions in the job data and the job request function correspondence table, the device configured to implement each job request function and the configuration data.

[Arrangement of Programmable Processing Unit]

Figure 3:
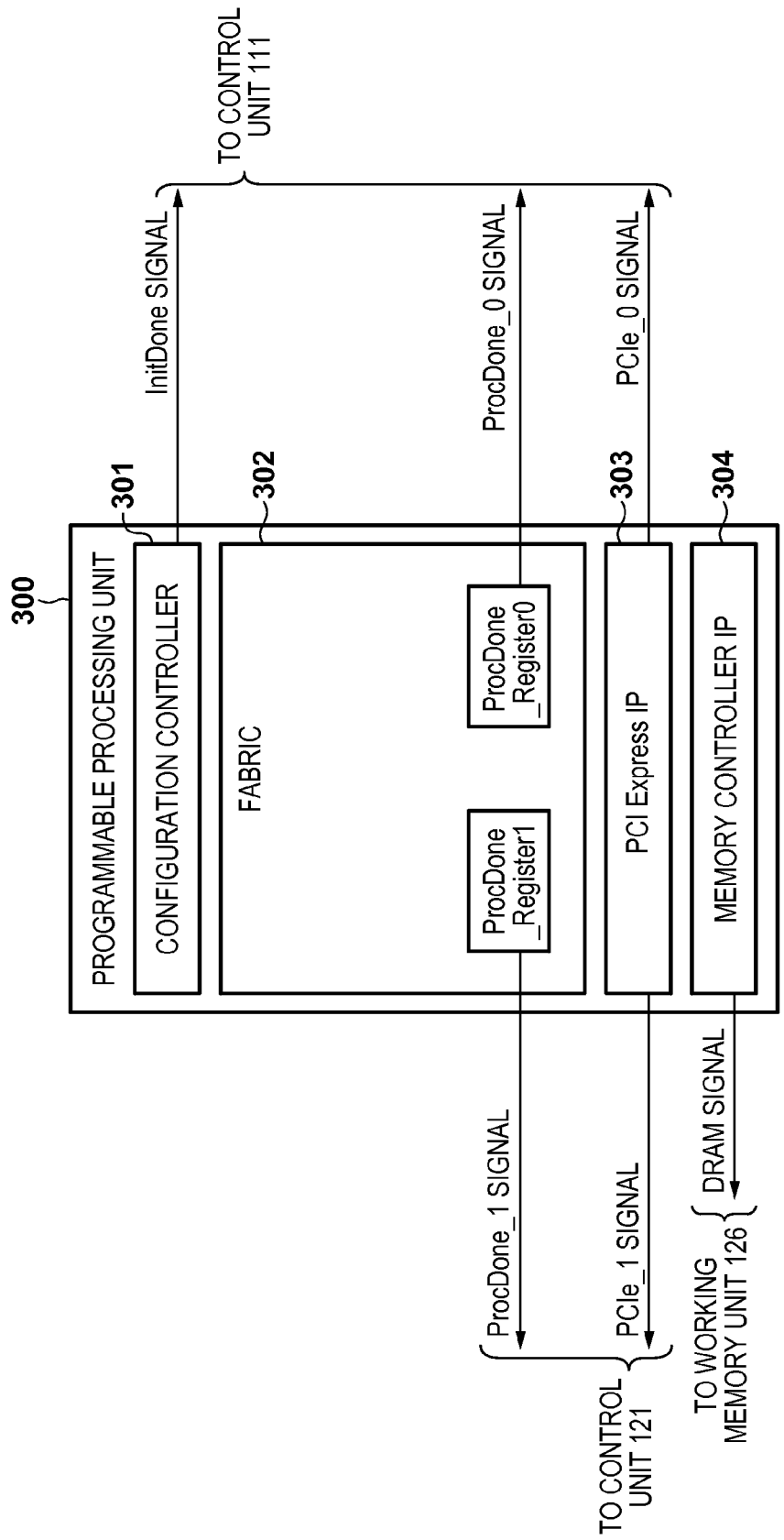
FIG. 3 is a block diagram showing an internal arrangement example of a programmable processing unit according to the first embodiment.

FIG. 3 is a block diagram showing an internal arrangement example of a programmable processing unit 300 according to the first embodiment. As described above, this embodiment will be described assuming that the programmable processing unit 300 is an FPGA.

A configuration controller 301 controls logic construction of a fabric 302, and parameter setting of a PCI Express IP 303 and a memory controller IP 304. The configuration controller 301 outputs the InitDone signal serving as the signal indicating the completion of the FPGA configuration. Logic based on the configuration data is constructed in the fabric 302. ProcDone_Register0 and ProcDone_Register1 are registers each indicating the execution end status of configured logic. A ProcDone_0 signal and a ProcDone_1 signal are generated from these registers. A description will be made assuming that ProcDone_Register0 and ProcDone_Register1 are mounted in the fabric 302 of this embodiment. Also assume that ProcDone_Register0 corresponds to the control unit 111 on the side of the standard processing unit 110 and ProcDone_Register1 corresponds to the control unit 121 on the side of the extension processing unit 120.

The PCI Express IP 303 is a protocol stack including a PCI Express PHY or the like. The programmable processing unit 300 and the PCI Express IP 303 according to this embodiment can implement a PCI Express connection for at least two ports. A PCIe_0 signal and a PCIe_1 signal of FIG. 3 indicate the PCI Express transmission/reception signal and clock signal connected to each port.

The memory controller IP 304 is a memory interface which includes a PHY or a controller and is compatible with a DDR standard or the like. A DRAM signal of FIG. 3 indicates a data signal, an address signal, a clock signal, or the like.

[Overall Sequence]

Figure 4:
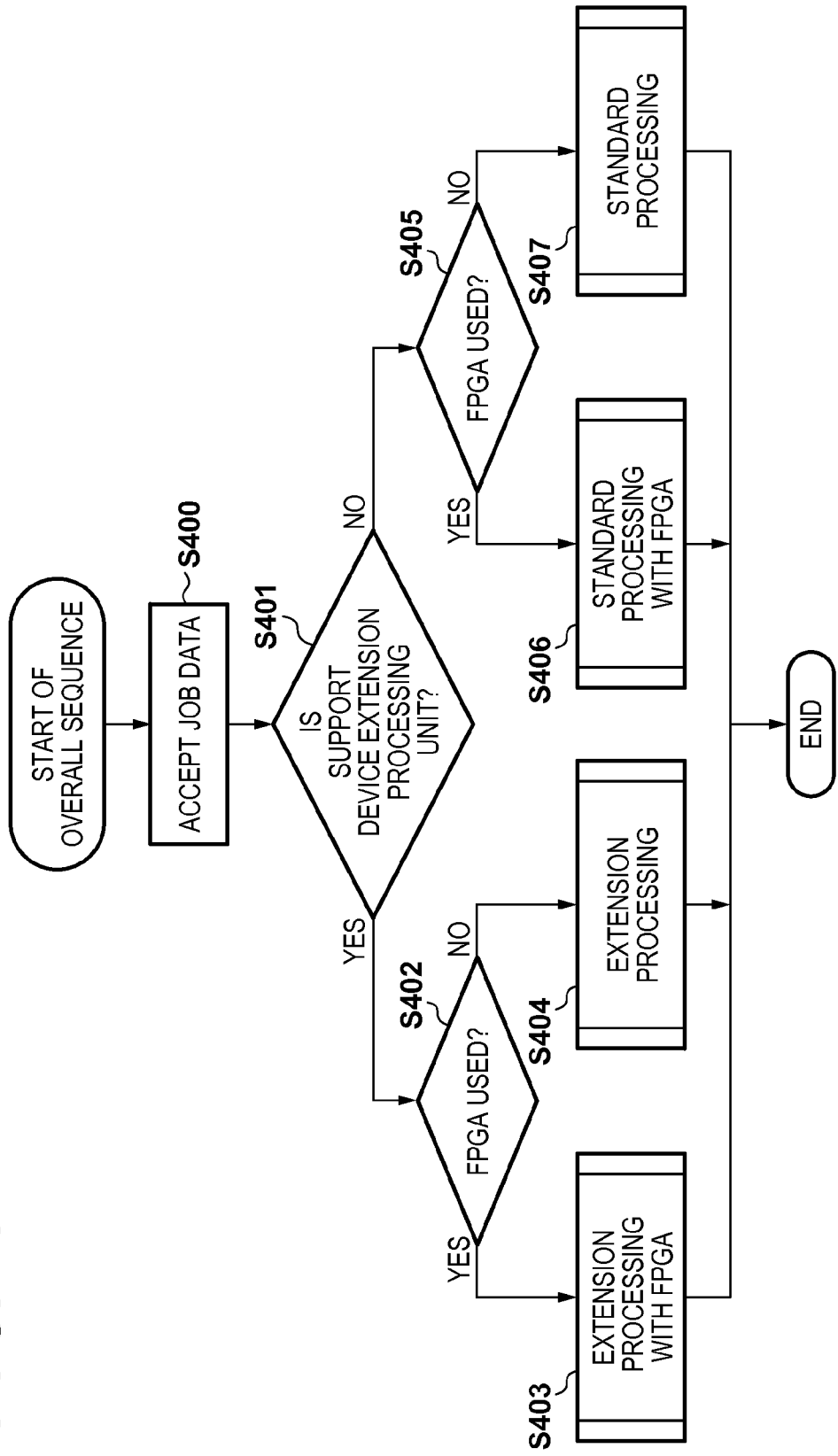
FIG. 4 is a flowchart showing an overall sequence according to the first and second embodiments.

FIG. 4 shows an overall sequence according to this embodiment. The control unit 111 of the standard processing unit 110 reads out software stored in the auxiliary storage unit 113 or the like, thereby implementing this processing sequence.

In step S400, the control unit 111 accepts the job data. The job data is generated and input by application software executed by the control unit 111 when the user operates the operation display unit 115. The job data may be generated and input from the external IF unit 114 via a network when the user operates the external information terminal.

In step S401, the control unit 111 determines whether the extension processing unit 120 is the support device for the function requested to process the job data. As described with reference to FIG. 2B, the control unit 111 compares information on the job request functions in the job data with the values of the "job request functions" and the "support devices" in the job request function correspondence table, thereby executing this determination. For example, if the job request function in the job data is an "extension OCR function", the support device is an "extension processing unit". If the control unit 111 determines, as a result of step S401, that the support device of the job data is the extension processing unit 120 (YES in step S401), the control unit 111 advances to step S402. On the other hand, if the control unit 111 determines that the support device of the job data is not the extension processing unit 120 (NO in step S401), the control unit 111 advances to step S405.

In step S402, the control unit 111 determines whether the job data is a job which uses the FPGA. As described above, the control unit 111 compares information on the job request functions in the job data with the values of the "job request functions" and the "FPGA usage" in the job request function correspondence table, thereby executing this determination. If the control unit 111 determines that the job data is the job which uses the FPGA (YES in step S402), the control unit 111 advances to step S403. On the other hand, if the control unit 111 determines that the job data is the job which does not use the FPGA (NO in step S402), the control unit 111 advances to step S404.

In step S403, the control unit 111, the control unit 121, and the programmable processing unit 300 cooperate to execute job processing. Details of this processing will be described later with reference to FIG. 5. After processing in this step, this processing sequence ends.

In step S404, the control unit 111 and the control unit 121 cooperate to execute job processing. Details of this processing will be described later with reference to FIG. 6. After processing in this step, this processing sequence ends.

In step S405, the control unit 111 determines whether the job data is the job which uses the FPGA. A practical determination method here is the same as in step S402. If the control unit 111 determines that the job data is the job which uses the FPGA (YES in step S405), the control unit 111 advances to step S406. On the other hand, the control unit 111 determines that the job data is the job which does not use the FPGA (NO in step S405), the control unit 111 advances to step S407.

In step S406, the control unit 111 and the programmable processing unit 300 cooperate to execute job processing. Details of this processing will be described later with reference to FIG. 7. After processing in this step, this processing sequence ends.

In step S407, the control unit 111 executes job processing. Details of this processing will be described later with reference to FIG. 8. After processing in this step, this processing sequence ends.

(Extension Processing with FPGA)

FIG. 5 is a flowchart showing extension processing with the FPGA according to the first embodiment and corresponds to processing in step S403 of FIG. 4. The control unit 111, the programmable processing unit 300, and the control unit 121 cooperate to implement this processing sequence.

In step S500, the control unit 111 transmits, to the extension processing unit 120, the job data accepted in step S400. This transmission is executed via the external IF unit 114 on the side of the standard processing unit 110 and the external IF unit 124 on the side of the extension processing unit 120.

In step S501, the control unit 111 instructs and executes the configuration for the programmable processing unit 300. The control unit 111 compares the information on the job request functions in the job data with the values of the "job request functions" and the "configuration data" in the job request function correspondence table, thereby determining data used for the configuration in step S501. The control unit 111 searches the data stored in the auxiliary storage unit 113 for the determined data.

In step S502, the control unit 111 receives a configuration completion notification transmitted from the programmable processing unit 300 after the instruction in step S501. This configuration completion notification is the InitDone signal shown in FIG. 3. The control unit 111 determines that the configuration of the programmable processing unit 300 has ended when the InitDone signal is asserted. The configuration completion notification is transmitted from the programmable processing unit 300 of the extension processing unit 120 in step S506 to be described later.

In step S503, the control unit 111 transmits a job executable notification to the extension processing unit 120. This transmission is executed via the external IF unit 114 and the external IF unit 124.

In step S504, the control unit 111 receives a job end notification from the extension processing unit 120 after the notification in step S503. This reception is executed via the external IF unit 114 and the external IF unit 124. The job end notification is transmitted from the control unit 121 of the extension processing unit 120 in step S513 to be described later. Note that until the control unit 111 receives a job end notification from the extension processing unit 120, the control unit 111 does not instruct an update of a function of the programmable processing unit 300 which is used by the extension processing unit 120 (that is, reconfiguration of the programmable processing unit 300). By this constitution, it is prevented that use of the programmable processing unit 300 by the extension unit 120 is prevented.

In step S505, the configuration controller 301 of the programmable processing unit 300 receives the instruction from the control unit 111 in step S501 and executes the configuration. The configuration data and a configuration instruction used here are transferred via a PCI Express interface (interface 130) between the control unit 111 and the programmable processing unit 300.

In step S506, the programmable processing unit 300 transmits the configuration completion notification to the control unit 111 after completing the configuration in step S505. As described above, this configuration completion notification is the InitDone signal shown in FIG. 3. The configuration controller 301 asserts the InitDone signal after configuring and initializing the fabric 302.

In step S507, the programmable processing unit 300 receives a process execution instruction from the control unit 121 and starts a process in accordance with that instruction.

In step S508, the programmable processing unit 300 notifies the control unit 121 of a process end after terminating the process. This process end notification is the ProcDone_1 signal shown in FIG. 3. Logic is configured to assert the ProcDone_1 signal by using the process end of the programmable processing unit 300 as a trigger.

In step S509, the control unit 121 receives the job data transmitted by the control unit 111 in step S500. This reception is executed by the external IF unit 114 and the external IF unit 124.

In step S510, the control unit 121 receives the job executable notification transmitted by the control unit 111 in step S503. This reception is executed by the external IF unit 114 and the external IF unit 124. In this processing sequence, this notification indicates that the control unit 121 can use a function provided by the configured programmable processing unit 300.

In step S511, the control unit 121 starts job processing based on the job data received in step S509. In addition, the control unit 121 issues, to the programmable processing unit 300, the process execution instruction using the function provided by the programmable processing unit 300.

In step S512, the control unit 121 determines whether job processing has ended. This determination is implemented by monitoring the ProcDone_1 signal serving as an end status signal output from the programmable processing unit 300 or by software parameter management of the control unit 121.

In step S513, the control unit 121 transmits the job end notification to the control unit 111 after determining that the process has ended in step S512. This transmission is executed via the external IF unit 114 and the external IF unit 124.

(Extension Processing)

Figure 6:
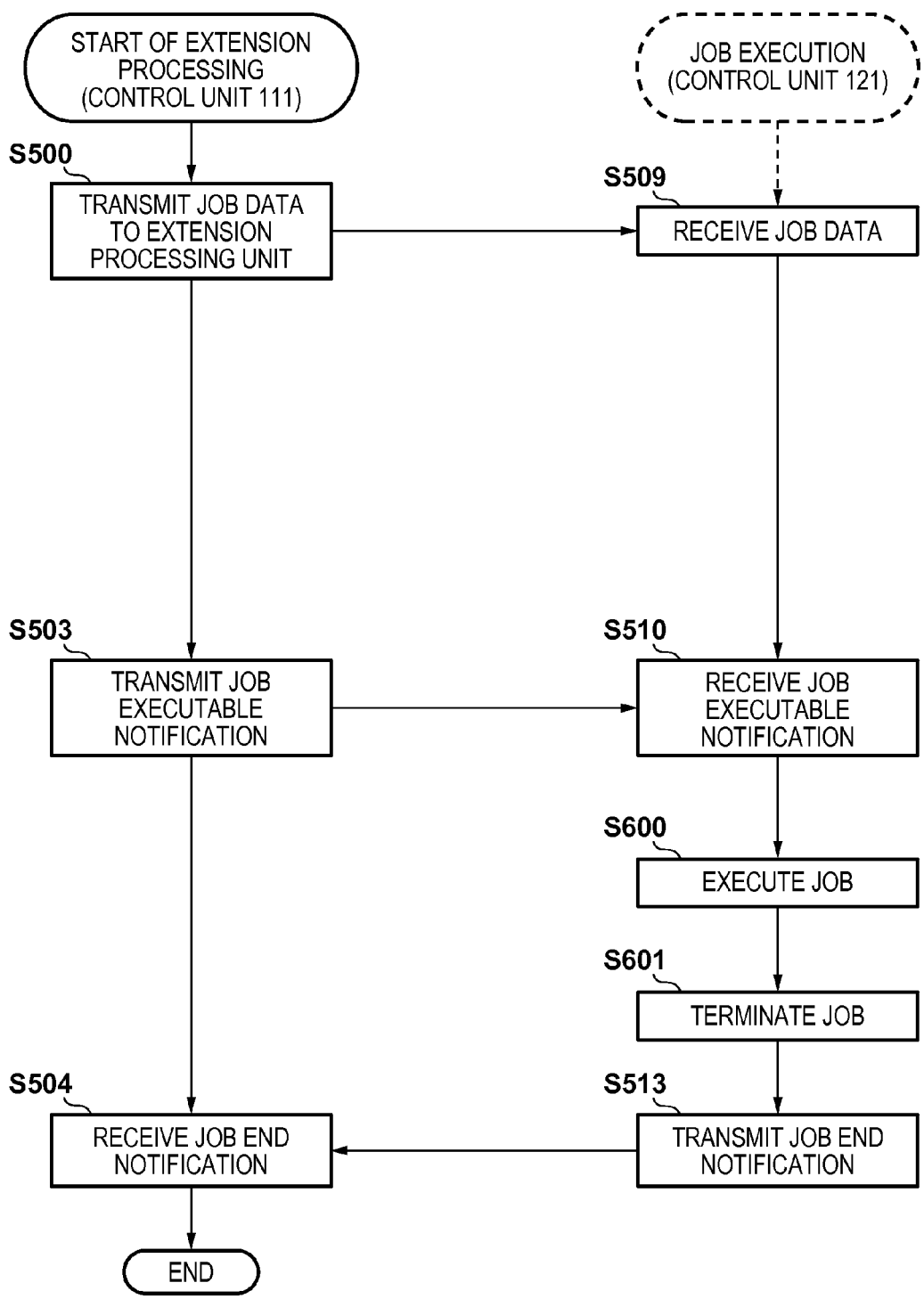
FIG. 6 is a flowchart showing extension processing according to the first embodiment.

FIG. 6 is a flowchart showing extension processing according to this embodiment and corresponds to processing in step S404 of FIG. 4. The control unit 111 and the control unit 121 cooperate to implement this processing sequence. As compared with the processing sequence in FIG. 5, steps S501, S502, and an FPGA execution processing are omitted in FIG. 6. This is because extension processing is executed when processing the job which does not use the FPGA. Out of respective steps described in FIG. 6, only the steps different from those in FIG. 5 will be described below.

In step S600, the control unit 121 starts job processing based on the job data received in step S509.

In step S601, the control unit 121 determines whether job processing has ended. This determination is implemented by software parameter management of the control unit 121.

(Standard Processing with FPGA)

Figure 7:
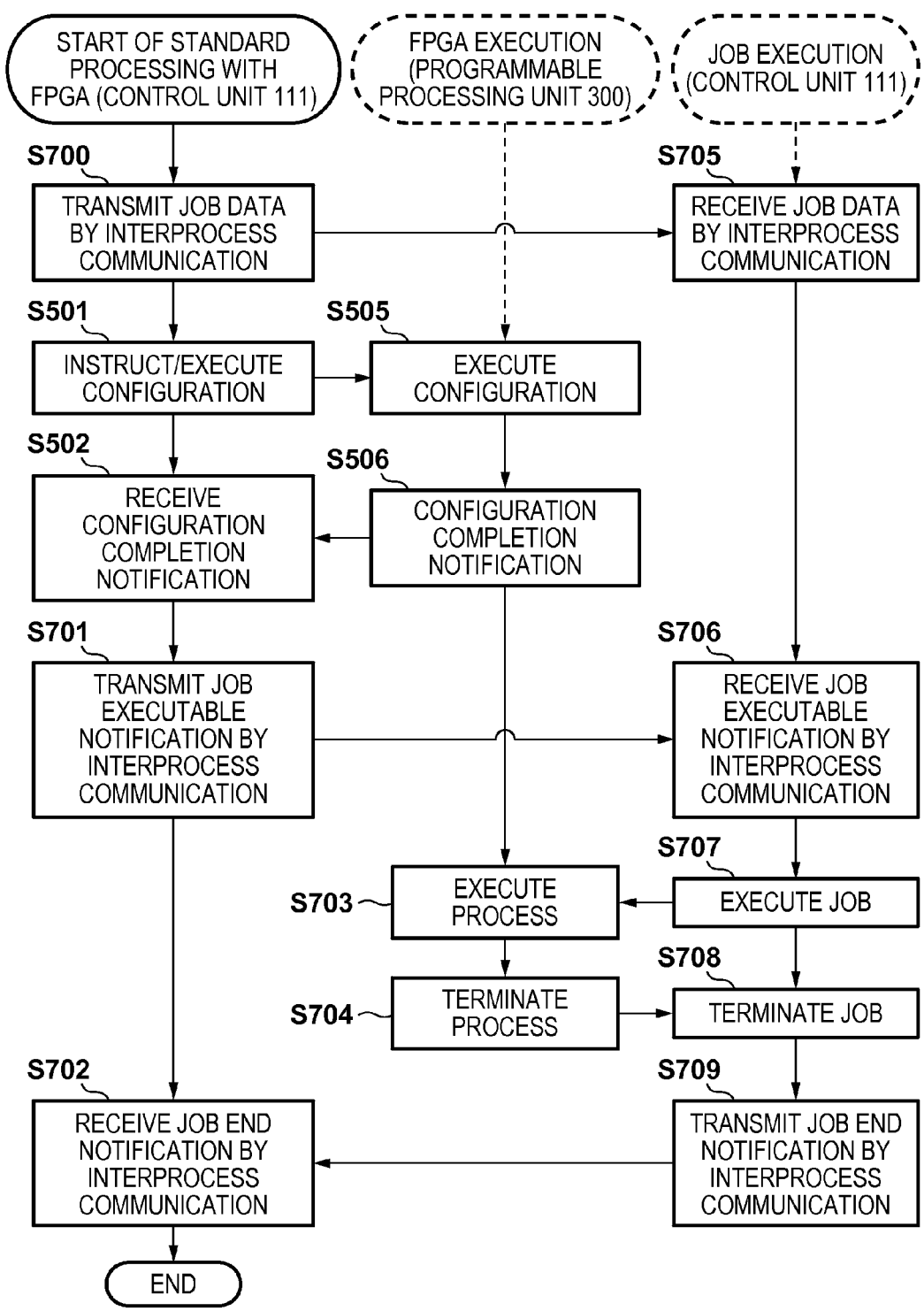
FIG. 7 is a flowchart showing standard processing with the FPGA according to the first embodiment.

FIG. 7 is a flowchart showing standard processing with the FPGA according to this embodiment and corresponds to processing in step S406 of FIG. 4. The control unit 111 and the programmable processing unit 300 cooperate to implement this processing sequence. The control unit 111 is configured to execute both standard processing with the FPGA and job execution shown in FIG. 7. A description will be made below, however, assuming that the control unit 111 executes them in separate processes. This is because a software diversion is considered between a case in which standard processing with the FPGA and job processing are executed by the control unit 121 as described in FIG. 5 and a case in which they are executed by the control unit 111 as in FIG. 7. Out of respective steps described in FIG. 7, only the steps different from those in FIG. 5 will be described below.

In step S700, a process of executing the standard processing with the FPGA transmits, by interprocess communication, the job data to a process of performing job execution.

In step S701, the process of executing the standard processing with the FPGA transmits, by interprocess communication, the job executable notification to the process of performing job execution after receiving the configuration completion notification from the programmable processing unit 300 in step S502.

In step S702, the process of executing the standard processing with the FPGA receives, by interprocess communication, the job end notification from the process of performing job execution after the notification in step S701.

In step S703, the programmable processing unit 300 receives a process execution instruction from the control unit 111 and starts a process.

In step S704, the programmable processing unit 300 notifies the control unit 111 of a process end after terminating the process. This process end notification is the ProcDone_0 signal shown in FIG. 3. Logic is configured to assert the ProcDone_0 signal by using the process end of the programmable processing unit 300 as a trigger.

In step S705, the process of performing job execution receives the job data transmitted by interprocess communication.

In step S706, the process of performing job execution receives the job executable notification transmitted by interprocess communication.

In step S707, the process of performing job execution starts job processing based on the job data after receiving the job executable notification in step S706. In addition, the process of performing job execution issues, to the programmable processing unit 300, the process execution instruction using the function provided by the programmable processing unit 300.

In step S708, the process of performing job execution determines whether job processing has ended. This determination is implemented by monitoring the ProcDone_0 signal serving as an end status signal output from the programmable processing unit 300 or by software parameter management of the control unit 111.

In step S709, the process of performing job execution transmits, by interprocess communication, the job end notification to the process of executing standard processing with the FPGA after determining that the process has ended in step S708.

(Standard Processing)

Figure 8:
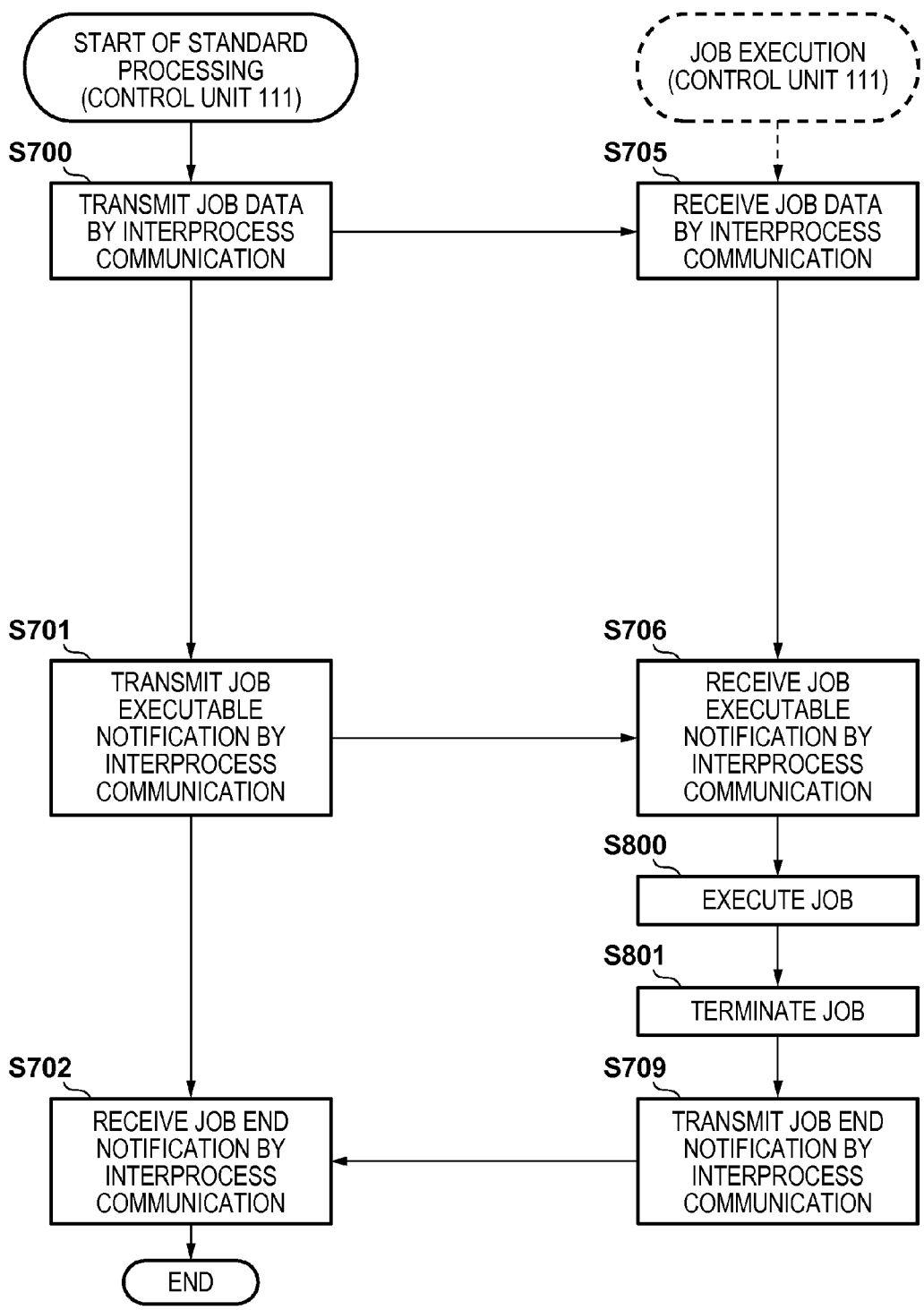
FIG. 8 is a flowchart showing standard processing according to the first embodiment.

FIG. 8 is a flowchart showing standard processing according to this embodiment and corresponds to processing in step S407 of FIG. 4. The control unit 111 implements this processing sequence. As compared with the processing sequence in FIG. 7, steps S501, S502, and an FPGA execution processing are omitted in FIG. 8. This is because standard processing is executed when processing the job which does not use the FPGA. Out of respective steps described in FIG. 8, only the steps different from those in FIG. 7 will be described below. As in the case shown in FIG. 7, although the control unit 111 is configured to execute both standard processing and job execution in this processing sequence, a description will be made assuming that they are executed in different processes.

In step S800, the process of performing job execution starts job processing based on the job data received in step S705 after receiving the job executable notification in step S706.

In step S801, the process of performing job execution determines whether job processing has ended. This determination is implemented by software parameter management of the control unit 111.

As described above, according to this embodiment, the control unit 111 manages the configuration and transmits the job executable notification to the control unit 121 in an arrangement in which the control unit 111 and the control unit 121 share the programmable processing unit 300. Such an arrangement obviates a need for the control unit 121 to request the configuration for the control unit 111. It is therefore possible to implement the configuration with a brief software configuration, and to allow each control unit to start the process using the programmable processing unit at an appropriate timing.

An example in which the two control units are used has been described in this embodiment. However, the present invention is not limited to this, and an arrangement with many more control units may be adopted.

<Second Embodiment>

In the first embodiment, an arrangement in which software notifies the completion of the configuration of the programmable processing unit 300 has been described. That is, the configuration controller 301 of the programmable processing unit 300 has notified the InitDone signal. In this embodiment, an arrangement in which hardware notifies the completion of the configuration will be described.

[Generation of ConfigEnable Signal]

Figure 9:
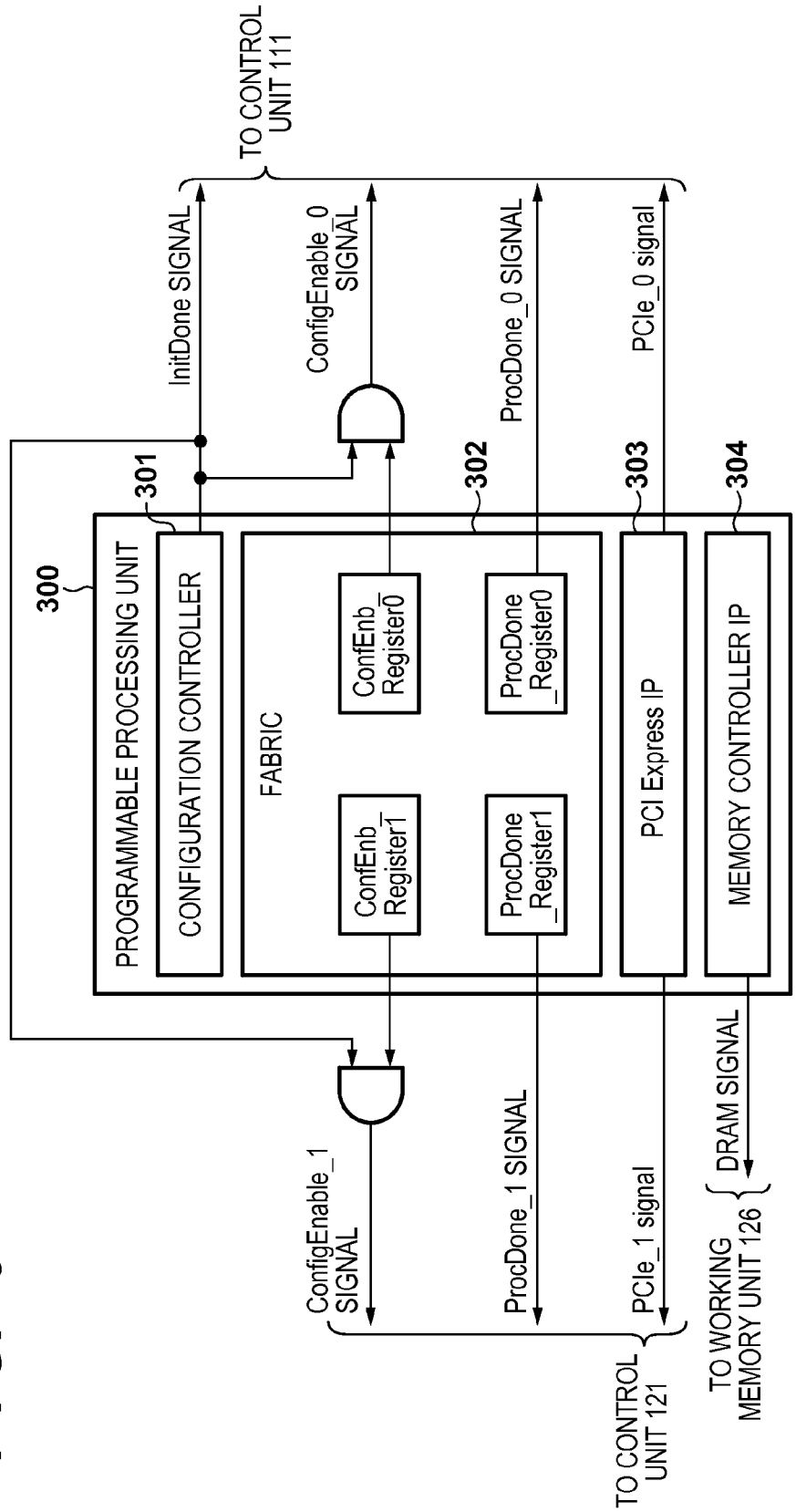
FIG. 9 is a block diagram showing the interior of a programmable processing unit and an arrangement example of a peripheral circuit according to the second embodiment.

In an image processing system 100 of the second embodiment, a programmable processing unit 300 generates a ConfigEnable_0/1 signal serving as a signal for notifying a control unit 111 and a control unit 121 of the completion of the configuration. FIG. 9 shows the internal arrangement of the programmable processing unit 300 configured to generate the ConfigEnable_0/1 signal. Note that the InitDone signal, the ProcDone_0/1 signal, the PCIe_0/1 signal, and the DRAM signal have already been described with reference to FIG. 3.

ConfEnab_Register0 and ConfEnb_Register1 are registers indicating that either of the control unit 111 and the control unit 121 should use the programmable processing unit 300. For example, if the control unit 111 uses the programmable processing unit 300, ConfEnab_Register0 outputs "1" and ConfEnb_Register1 outputs "0". On the other hand, if the control unit 121 uses the programmable processing unit 300, ConfEnab_Register0 outputs "0" and ConfEnb_Register1 outputs "1". The control unit 111 which performs configuration control rewrites, at the completion of the configuration, the setting of ConfEnb_Register0/1 into an appropriate value.

Note that a value that should be output by ConfEnb_Register0/1 can also be embedded in configuration data as a default value. Such an arrangement may be adopted because either of the control units uses the programmable processing unit 300 is determined in accordance with the configuration data.

The ConfigEnable_0 signal and the ConfigEnable_1 signal become an AND logic signal between an InitDone signal and the output of ConfEnb_Register0 or ConfEnb_Register1. Such an arrangement allows each control unit to detect, without using interprocess communication, that the configuration for either of the control unit 111 and the control unit 121 has ended.

[Extension Processing with FPGA]

Figure 10:
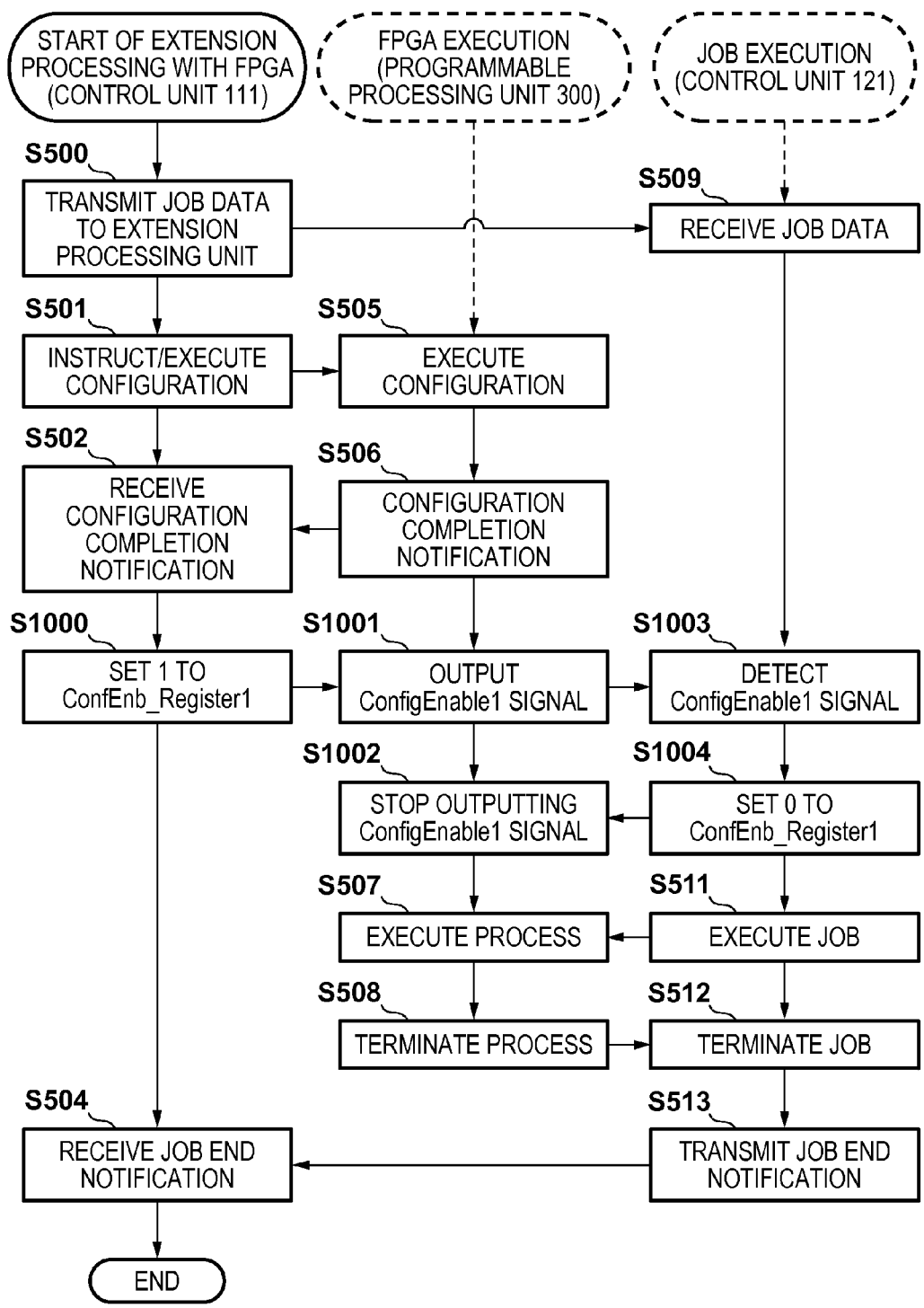
FIG. 10 is a flowchart showing extension processing with an FPGA according to the second embodiment.

FIG. 10 is a flowchart showing extension processing with an FPGA according to this embodiment and corresponds to processing in step S403 of FIG. 4 described in the first embodiment. The control unit 111, the programmable processing unit 300, and the control unit 121 cooperate to implement this processing sequence. Only a difference from FIG. 5 described in the first embodiment will be described below.

In step S1000, the control unit 111 sets "1" for ConfEnb_Register1 of the programmable processing unit 300. This indicates that the control unit 121 uses the programmable processing unit 300. As described above, when setting "1" as the default value of ConfEnb_Register1 and generating the configuration data, processing in step S1000 is omitted.

In step S1001, the programmable processing unit 300 asserts the ConfigEnable_1 signal for the control unit 121. As shown in FIG. 9, this is implemented by AND logic between the InitDone signal asserted upon the completion of the configuration in step S506 and the output of ConfEnb_Register1.

In step S1002, the programmable processing unit 300 deasserts the ConfigEnable_1 signal for the control unit 121. This is implemented when the control unit 121 sets "0" for ConfEnb_Register1 in step S1004.

In step S1003, the control unit 121 detects the ConfigEnable_1 signal asserted by the programmable processing unit 300 in step S1001.

In step S1004, the control unit 121 sets "0" for ConfEnb_Register1 of the programmable processing unit 300.

[Standard Processing with FPGA]

Figure 11:
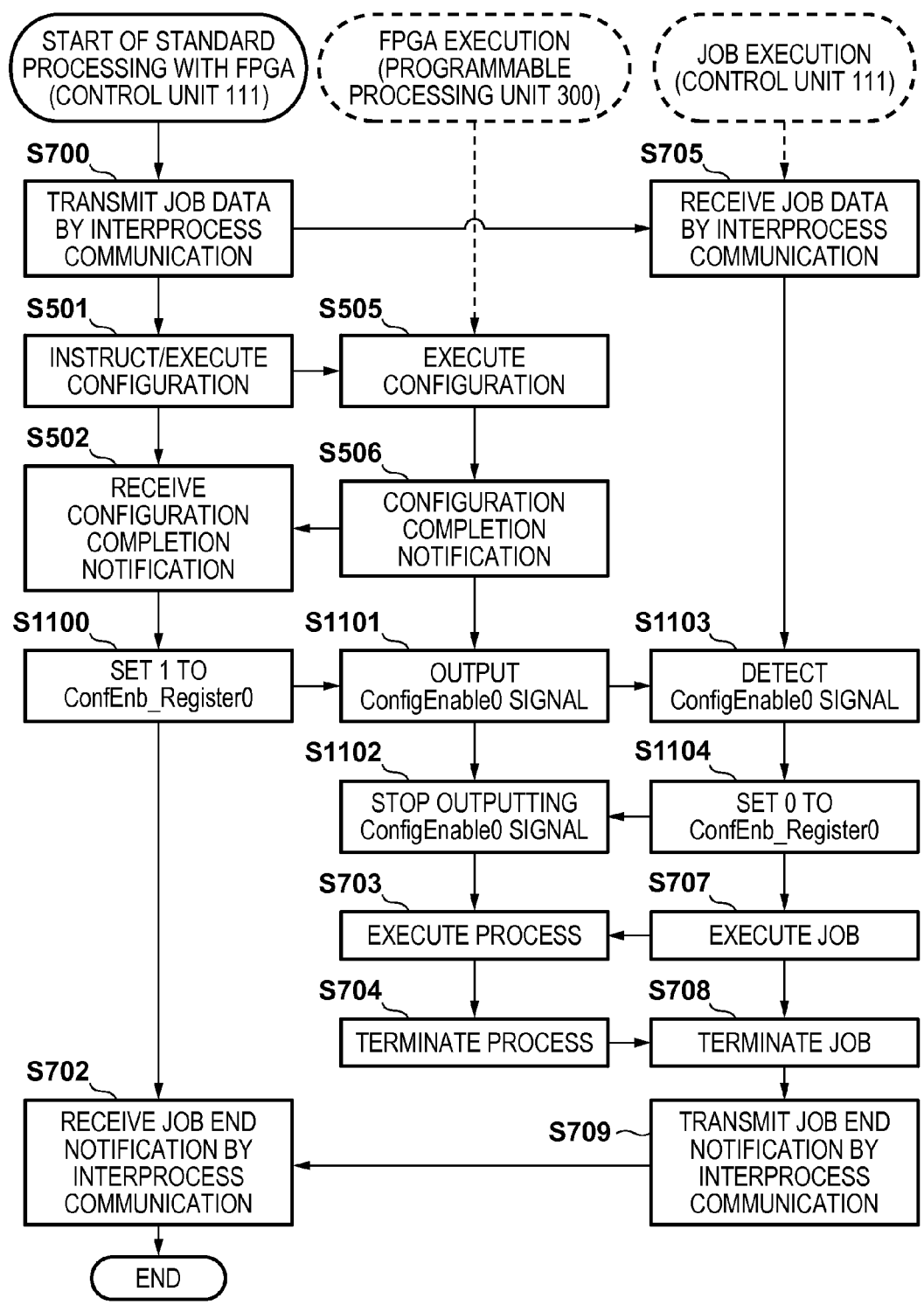
FIG. 11 is a flowchart showing standard processing with the FPGA according to the second embodiment.

FIG. 11 is a flowchart showing standard processing with an FPGA according to this embodiment and corresponds to processing in step S406 of FIG. 4 described in the first embodiment. The control unit 111 and the programmable processing unit 300 cooperate to implement this processing sequence. Only a difference from FIG. 7 described in the first embodiment will be described below. As in the case shown in FIG. 7, although the control unit 111 is configured to execute both standard processing and job execution in this processing sequence, a description will be made assuming that they are executed in different processes.

In step S1100, a process of executing standard processing with the FPGA sets "1" for ConfEnb_Register0 of the programmable processing unit 300. As described above, when setting "1" as the default value of ConfEnb_Register0 and generating the configuration data, processing in step S1100 is omitted.

In step S1101, the programmable processing unit 300 asserts the ConfigEnable_0 signal for the control unit 111. As shown in FIG. 9, this is implemented by AND logic between the InitDone signal asserted upon the completion of the configuration in step S506 and the output of ConfEnb_Register0.

In step S1102, the programmable processing unit 300 deasserts the ConfigEnable_0 signal for the control unit 111. This is implemented when the control unit 111 sets "0" for ConfEnb_Register0 in step S1104.

In step S1103, the control unit 111 detects the ConfigEnable_0 signal asserted by the programmable processing unit 300 in step S1101.

In step S1104, the control unit 111 sets "0" for ConfEnb_Register0 of the programmable processing unit 300.

Note that the processing contents of extension processing (step S404 in FIG. 4) and standard processing (step S407 in FIG. 4) in this embodiment are the same as in the first embodiment, and thus a description thereof will be omitted.

As described above, according to this embodiment, the control unit 111 manages the configuration in an arrangement in which the control unit 111 and the control unit 121 share the programmable processing unit 300. Further, the ConfigEnable_0/1 signal which notifies the completion of the configuration is output from the programmable processing unit 300 to each control unit. Such an arrangement obviates a need for the control unit 121 to request the configuration for the control unit 111. Furthermore, the control unit 111 need not generate or transmit the job executable notification which has been needed in the first embodiment. It is therefore possible to implement the configuration with a briefer software configuration than in the first embodiment, and to allow each control unit to start the process using the programmable processing unit at an appropriate timing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-197510, filed Sep. 26, 2014, which is hereby incorporated by reference herein in its entirety.

What is claimed is:

1. An information processing apparatus comprising:
a programmable processing unit configured to change a circuit configuration by a configuration;
a first processor connected to the programmable processing unit;
a second processor connected to the programmable processing unit; and
a memory coupled to the first processor and the second processor, storing instructions that, when executed, cause:
the first processor to provide a first instruction to cause the programmable processing unit to perform a first configuration for a first job to be processed by the first processor, and to process the first job by means of the programmable processing unit which has changed the circuit configuration according to the first instruction;
the first processor to provide a second instruction to cause the programmable processing unit to perform a second configuration for a second job to be processed by the second processor; and
the second processor to process the second job by means of the programmable processing unit which has changed the circuit configuration according to the second instruction.

2. The information processing apparatus according to claim 1,
wherein the first processor is configured to transfer a notification to the second processor according to a completion of the changing of the circuit configuration for the second job to be processed by the second processor, and
wherein the second processor is configured to receive the notification transferred by the first processor, and to start, according to the reception of the notification, to process the second job by means of the programmable processing unit which has changed the circuit configuration according to the second instruction.

3. The information processing apparatus according to claim 1,
wherein the second processor is further configured to transfer a notification to the first processor according to a completion of the processing of the second job, and
wherein the first processor is further configured to receive the notification transferred by the second processor, and to instruct, according to the reception of the notification, the programmable processing unit to perform a configuration which causes the circuit configuration utilized by the second processor to change.

4. The information processing apparatus according to claim 1, wherein the first processor is further configured:
to provide the first instruction to cause the programmable processing unit to perform the first configuration for the first job to be processed by the first processor;
to transfer a notification via interprocess communication to the first processor according to a completion of the changing of the circuit configuration for the first job;
to receive, via the interprocess communication, the notification transferred by the first processor; and
to start, according to the reception of the notification, to process the first job by means of the programmable processing unit which has changed the circuit configuration according to the instruction.

5. The information processing apparatus according to claim 1, wherein the instructions, when executed, further cause the first processor to determine, in accordance with a function requested in a job, that second processor is to process the job.

6. The information processing apparatus according to claim 5, wherein the memory stores further instructions that, when executed, cause the first processor to determine, in accordance with the function requested in the job, whether to utilize the programmable processing unit when processing the job.

7. The information processing apparatus according to claim 1, wherein the memory stores further instructions that, when executed, cause the first processor to provide the first instruction to cause the programmable processing unit to perform the first configuration with first configuration data, and to perform the second configuration with second configuration data different from the first configuration data.

8. The information processing apparatus according to claim 1, wherein the programmable processing unit is an FPGA (Field Programmable Gate Array).

9. An information processing apparatus comprising:
a programmable processing unit configured to rewrite processing contents by a configuration;
at least two processors which are connected to the programmable processing unit; and
a memory coupled to the at least two processors, storing instructions that, when executed, cause:
the at least two processors to share the programmable processing unit;
one processor out of the at least two processors to control a configuration of the programmable processing unit in accordance with an accepted job;
each of the at least two processors to set, for the programmable processing unit, the at least two processors, respectively, to be configured to process a respective job by using the programmable processing unit; and
the programmable processing unit to notify, after the configuration, each of the set at least two processors, respectively, of information indicating that the configuration has ended.

10. The information processing apparatus according to claim 9, wherein the memory stores further instructions that, when executed, cause:
a first one of the at least two processors to set a second one of the least two processors to be configured to use the programmable processing unit after completing the configuration, and
the second one of the at least two processors to set the first one of the at least two processors to be configured to use the programmable processing unit after detecting the notification from the notification unit.

11. The information processing apparatus according to claim 10, wherein the memory stores further instructions that, when executed, cause at least one of the first one or second one of the at least two processors to be configured to use the programmable processing unit by using a register of the programmable processing unit.

12. A control method of an information processing apparatus including a programmable processing unit configured to change a circuit configuration by a configuration, a first processor connected to the programmable processing unit, and a second processor connected to the programmable processing unit, the method comprising:
providing, by the first processor, a first instruction to cause the programmable processing unit to perform a first configuration for a first job to be processed by the first processor;
processing, by the first processor, the first job by means of the programmable processing unit which has changed the circuit configuration according to the first instruction;
providing, by the first processor, a second instruction to cause the programmable processing unit to perform a second configuration for a second job to be processed by the second processor; and
processing, by the second processor, the second job by means of the programmable processing unit which has changed the circuit configuration according to the second instruction.

13. The control method according to claim 12, further comprising:
transferring, by the first processor, a notification to the second processor according to a completion of the changing of the circuit configuration for the second job to be processed by the second processor;
receiving, by the second processor, the notification transferred by the first processor; and
starting, by the second processor, according to the reception of the notification, to process the second job by means of the programmable processing unit which has changed the circuit configuration according to the instruction.

14. The control method according to claim 12, further comprising:
transferring, by the second processor, a notification to the first processor according to a completion of the processing of the second job;
receiving, by the first processor, the notification transferred by the second processor; and
instructing, by the first processor, according to the reception of the notification, the programmable processing unit to perform a configuration which causes the circuit configuration utilized by the second processor to change.

* * * * *